(12) United States Patent
Shimizu et al.

(10) Patent No.: US 12,044,555 B2
(45) Date of Patent: Jul. 23, 2024

(54) DISPLACEMENT DETECTION DEVICE

(71) Applicant: Murata Machinery, Ltd., Kyoto (JP)

(72) Inventors: Tetsuya Shimizu, Kyoto (JP); Kentaro Otomo, Kyoto (JP); Ryohei Kido, Kyoto (JP)

(73) Assignee: Murata Machinery, Ltd., Kyoto (JP)

( * ) Notice: Subject to any disclaimer, the term of this patent is extended or adjusted under 35 U.S.C. 154(b) by 132 days.

(21) Appl. No.: 17/960,180

(22) Filed: Oct. 5, 2022

(65) Prior Publication Data
US 2023/0116491 A1 Apr. 13, 2023

(30) Foreign Application Priority Data

Oct. 7, 2021 (JP) ................................. 2021-165472

(51) Int. Cl.
| | |
|---|---|
| *G01D 5/244* | (2006.01) |
| *G01D 3/032* | (2006.01) |
| *G01D 5/20* | (2006.01) |
| *G01D 5/245* | (2006.01) |
| *H03M 1/12* | (2006.01) |

(52) U.S. Cl.
CPC ......... *G01D 5/24428* (2013.01); *G01D 3/032* (2013.01); *G01D 5/2046* (2013.01); *G01D 5/2451* (2013.01); *H03M 1/12* (2013.01); *H03M 1/1205* (2013.01)

(58) Field of Classification Search
CPC .. G01D 5/24428; G01D 5/2451; G01D 3/032; G01D 5/2258; G01D 5/2046; H03M 1/12; H03M 1/1205
USPC ................................................... 324/207.22
See application file for complete search history.

(56) References Cited

U.S. PATENT DOCUMENTS

| | | | | |
|---|---|---|---|---|
| 2011/0106488 A1* | 5/2011 | Fujita | ............... | G01C 22/006 702/150 |
| 2015/0035519 A1* | 2/2015 | Buelau | ............... | G01D 5/2291 324/207.18 |
| 2017/0074682 A1* | 3/2017 | Kántor | ............... | G01D 5/2053 |
| 2022/0163313 A1* | 5/2022 | Shimizu | ............... | G01D 5/2086 |
| 2024/0128902 A1* | 4/2024 | Shimizu | ............... | G01D 5/245 |

FOREIGN PATENT DOCUMENTS

| | | |
|---|---|---|
| JP | H05-248891 A | 9/1993 |
| JP | H09-318304 A | 12/1997 |

\* cited by examiner

*Primary Examiner* — Raul J Rios Russo
(74) *Attorney, Agent, or Firm* — DLA Piper LLP (US)

(57) ABSTRACT

A processing device of a displacement detection device includes an AD conversion device, a switching circuit, and an arithmetic processing unit. The AD conversion device has first and second AD conversion units. The switching circuit periodically switches between a first connection mode in which a first differential signal is AD-converted by the first AD conversion unit and a second differential signal is AD-converted by the second AD conversion unit, and a second connection mode in which the first differential signal is AD-converted by the second AD conversion unit and the second differential signal is AD-converted by the first AD conversion unit. The arithmetic processing unit outputs displacement information of a scale based on an addition average value of the first differential signals output from the first and second AD conversion units and an addition average value of the second differential signals output from the first and second AD conversion units.

6 Claims, 6 Drawing Sheets

FIG. 2

FIG. 4 d: GAIN VARIATION OF FIRST AD CONVERSION UNIT WHEN ENVIRONMENT 1 CHANGES TO ENVIRONMENT 2
e: GAIN VARIATION OF SECOND AD CONVERSION UNIT WHEN ENVIRONMENT 1 CHANGES TO ENVIRONMENT 2

FIG. 5 d: GAIN VARIATION OF FIRST AD CONVERSION UNIT WHEN ENVIRONMENT 1 CHANGES TO ENVIRONMENT 2
e: GAIN VARIATION OF SECOND AD CONVERSION UNIT WHEN ENVIRONMENT 1 CHANGES TO ENVIRONMENT 2

FIG. 6

DISPLACEMENT DETECTION DEVICE

TECHNICAL FIELD

This disclosure mainly relates to a displacement detection device that detects displacement information of a measurement object.

BACKGROUND

Conventionally, a displacement detection device that measures displacement information of a measurement object using an electromagnetic induction phenomenon is known. Japanese Unexamined Patent Publication Nos. 9-318304 and 5-248891 disclose this type of device.

The position detection device disclosed in Japanese Unexamined Patent Publication No. 9-318304 is an induction sensor including an iron core and a winding part. The position detection device is movable relative to a rail constituted of a magnet. The position detection device detects a relative position with respect to the rail on the basis of an output signal generated when the position detection device moves with respect to the rail. A phase variation error might occur due to a change in an impedance of the winding part. To cope with a phase variation error, the position detection device of Japanese Unexamined Patent Publication No. 9-318304 includes a zero cross detection circuit that detects a zero cross of the output signal. A detection result of the zero-cross detection circuit is output to a latch circuit as a latch pulse. Since data latched in the latch circuit corresponds to a phase deviation of the output signal, a phase variation error is calculated on the basis of an average of the data.

The device disclosed in Japanese Unexamined Patent Publication No. 5-248891 is an evaluation circuit that evaluates an induction sensor. The device is provided with an analog switch including two switch elements. A first switch element generates vibration by alternately connecting a resistor to the ground and a reference voltage. A second switch element corresponds to an analog switch of a synchronous rectifier. Since the two switch elements are provided on the same chip, phase positions of vibrations generated by the two switch elements can be made the same.

A displacement detection device using an electromagnetic induction phenomenon may be provided with two AD conversion units that convert an electric signal based on an induced current from an analog signal to a digital signal. Since the AD conversion unit has environmental characteristics, the characteristics change according to a change in environment. As a result, an error might occur in a detection value of displacement information due to a difference in environmental characteristics between the two AD conversion units.

It could therefore be helpful to provide a displacement detection device capable of suppressing an error caused by a difference in environmental characteristics between two AD conversion units.

SUMMARY

We thus provide a displacement detection device having the following configuration. Specifically, the displacement detection device includes a scale, a sensor head, and a processing device. In the scale, magnetic response units and non-magnetic response units are alternately arranged at a predetermined detection pitch in a displacement detection direction. The sensor head has at least four magnetic detection elements that output signals expressed by a sine function, a cosine function, a minus sine function, and a minus cosine function, respectively. The processing device receives input of an output signal of the magnetic detection element, and calculates and outputs displacement information that is at least one of a relative displacement of the scale with respect to the sensor head and a change rate of the relative displacement. The processing device includes an AD conversion device, a switching circuit, and an arithmetic processing unit. The AD conversion device has a first AD conversion unit and a second AD conversion unit. The AD conversion device converts a first differential signal based on a difference between the cosine function and the minus cosine function and a second differential signal based on a difference between the sine function and the minus sine function into digital signals. The switching circuit that periodically switches between a first connection mode in which the first differential signal is AD-converted by the first AD conversion unit and the second differential signal is AD-converted by the second AD conversion unit, and a second connection mode in which the first differential signal is AD-converted by the second AD conversion unit and the second differential signal is AD-converted by the first AD conversion unit. The arithmetic processing unit outputs the displacement information of the scale on the basis of an addition average value of the first differential signals output from the first AD conversion unit and the second AD conversion unit and an addition average value of the second differential signals output from the first AD conversion unit and the second AD conversion unit.

As a result, influences of environmental characteristics of the first AD conversion unit and environmental characteristics of the second AD conversion unit on the respective differential signals can be made uniform. Therefore, it is possible to suppress an error in the displacement information when the environment changes.

The arithmetic processing unit preferably calculates the displacement information of the scale by arctan calculation.

As a result, displacement information can be obtained by simple arithmetic operation.

The arithmetic processing unit preferably performs even-numbered stage moving average processing on the displacement information obtained by the arctan calculation.

As a result, by setting the moving average processing to the even-numbered stages, the number of the detection values in the first connection mode and the number of the detection values in the second connection mode can be equalized to calculate the addition average value so that the error of the displacement information can be further suppressed.

The above and other elements, features, steps, characteristics and advantages will become more apparent from the following detailed description of the preferred examples with reference to the attached drawings.

DETAILED DESCRIPTION

Next, a representative example will be described with reference to the drawings.

Figure 1:
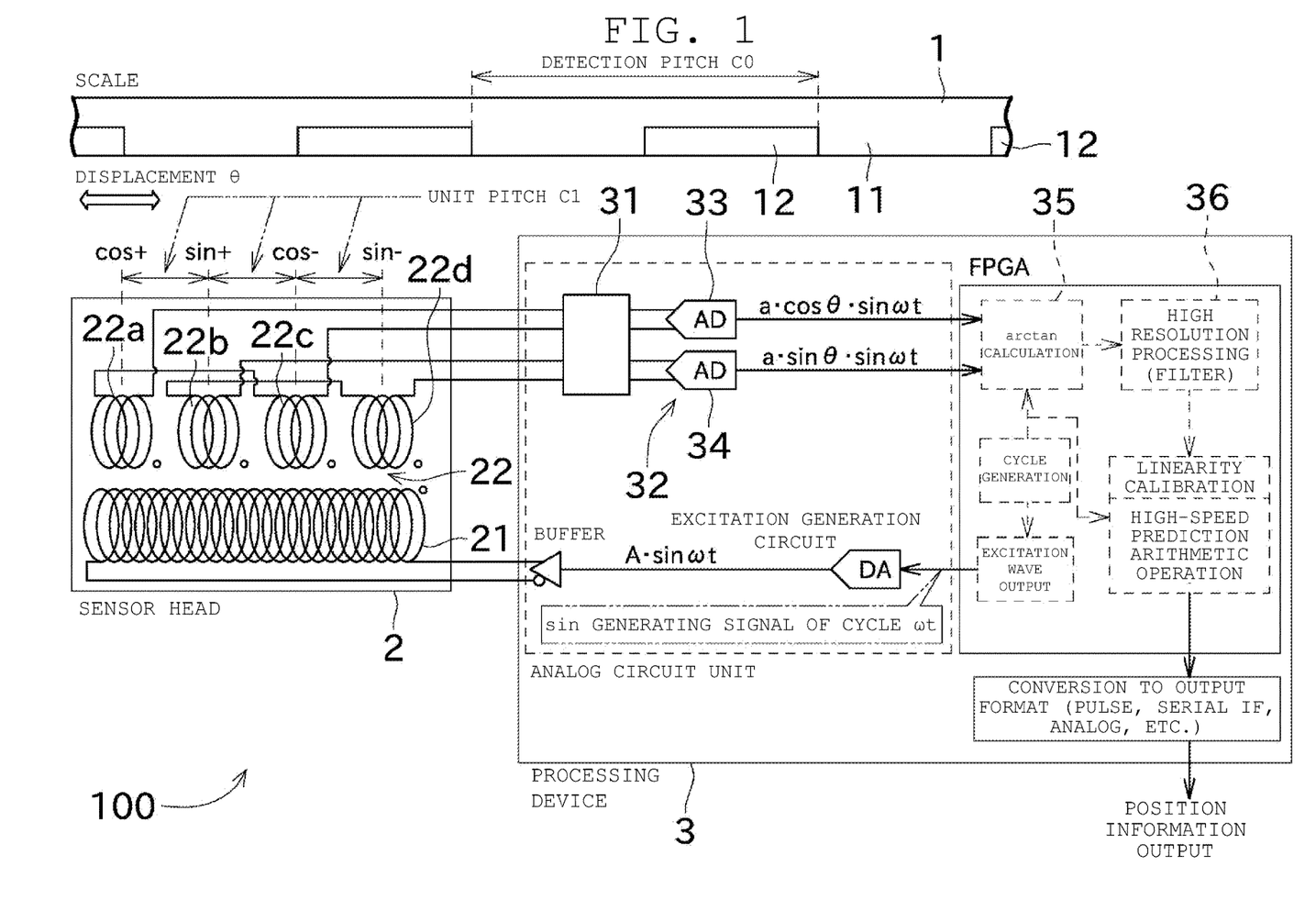
FIG. 1 is a block diagram illustrating a configuration of a displacement detection device according to an example.

A displacement detection device 100 illustrated in FIG. 1 detects displacement of a measurement object in a predetermined direction. In the following description, a direction in which displacement (displacement information) of the measurement object is detected is referred to as a displacement detection direction.

Displacement is a change amount of a current position with respect to a reference position. Reference position is, for example, an initial position. By defining position information of the reference position, a position of the measurement object can be calculated on the basis of the reference position and displacement. Therefore, the displacement detection device 100 can be used as a position detection device.

The displacement detection device 100 mainly includes a scale 1, a sensor head 2, and a processing device 3.

One of the scale 1 and the sensor head 2 is attached to the measurement object. For example, the scale 1 is attached to a movable member (not illustrated), and the sensor head 2 is attached to a fixed member (not illustrated) which is the measurement object. The movable member is linearly movable along a path parallel to the displacement detection direction.

Alternatively, the scale 1 may be attached to the fixed member as the measurement object, and the sensor head 2 may be attached to the movable member. Further, both the scale 1 and the sensor head 2 may be attached to movable members that are relatively displaced from each other. In this configuration, the displacement detection device 100 detects relative displacement of the measurement object (i.e., the scale 1 and the sensor head 2).

The scale 1 is used as a scale for detecting displacement of the measurement object in a longitudinal direction of the scale 1. The scale 1 is formed to be elongated in a direction parallel to a movement stroke of the sensor head 2 along with movement of the movable member. The scale 1 may be formed in an elongated block shape or an elongated rod shape.

The scale 1 includes a non-magnetic response unit 11 and a magnetic response unit 12. The non-magnetic response unit 11 is made of, for example, a material such as metal having no distinguished magnetism or plastic having no magnetism. The magnetic response unit 12 is made of, for example, metal having ferromagnetism. The non-magnetic response units 11 and the magnetic response units 12 are alternately arranged in the longitudinal direction of the scale 1. An interval between the adjacent non-magnetic response units 11 and an interval between the adjacent magnetic response units 12 are predetermined detection pitches C0. Therefore, in the scale 1, presence or absence of magnetic responsiveness, or strong or weak magnetic responsiveness alternately and repeatedly appears at each detection pitch C0 in the longitudinal direction.

As illustrated in FIG. 1, the sensor head 2 is disposed at a predetermined interval from the magnetic response unit 12. For example, the scale 1 has an elongated rod shape, the sensor head 2 has a cylindrical shape, and the scale 1 is inserted into the sensor head 2. The shape of the sensor head 2 is not limited to this example. The sensor head 2 includes a primary coil 21 and a plurality of secondary coils 22. In this example, four secondary coils 22 are provided. The primary coil 21 can be omitted.

The primary coil 21 is used to generate an AC magnetic field. When an alternating current flows through the primary coil 21, a magnetic field whose direction and intensity periodically change is generated around the primary coil. A periodic excitation signal (A·sin ωt) obtained by DA-converting an excitation wave generated by the processing device 3 is applied to the primary coil 21. A cycle of the excitation signal is referred to as an excitation cycle. As illustrated in FIG. 1, the primary coil 21 is disposed, in the sensor head 2, in a portion farther from the scale 1 than the secondary coil 22.

As illustrated in FIG. 1, the four secondary coils 22 are disposed side by side in a direction parallel to the longitudinal direction of the scale 1. The secondary coil 22 is disposed, in the sensor head 2, in a portion closer to the scale 1 than the primary coil 21. An induced current generated by the magnetic field strengthened by the magnetic response unit 12 flows through the four secondary coils 22. The sensor head 2 detects and outputs an electric signal (e.g., a voltage signal) based on the induced current.

As illustrated in FIG. 1, the four secondary coils 22 are arranged side by side at each predetermined unit pitch C1 in the displacement detection direction. The unit pitch C1 has the following relationship with the above-described detection pitch C0. Specifically, as indicated by the following formula, the unit pitch C1 is set to be a sum of an integral multiple of the detection pitch C0 and ¼ of the detection pitch C0:

$$C1 = (n + 1/4) \cdot C0.$$

n is an integer. Although n=0 in this example, n is not limited thereto.

In the following description, to specify each of the four secondary coils, the four secondary coils may be referred to as a first coil 22a, a second coil 22b, a third coil 22c, and a fourth coil 22d in this order from the left side illustrated in FIG. 1.

A signal (e.g., a voltage signal) output from each secondary coil 22 will be briefly described. When an alternating current flows through the primary coil 21, a magnetic field whose direction and intensity periodically change is generated in the primary coil 21. On the other hand, in the secondary coil 22, an induced current in a direction that prevents a change in the magnetic field of the coil is generated. When a ferromagnetic substance exists in the vicinity of the primary coil 21, the ferromagnetic substance acts to strengthen the magnetic field generated by the primary coil 21. This effect increases as the ferromagnetic substance approaches the primary coil 21.

Focusing on the magnetic response unit 12, as the sensor head 2 relatively moves from one side to the other side in the longitudinal direction of the scale 1, a distance from the primary coil 21 to the magnetic response unit 12 and a distance from the secondary coil 22 to the magnetic response unit 12 change. Specifically, these distances gradually decrease as the sensor head 2 moves, and gradually increase after exceeding a minimum value. Although the induced current generated in the secondary coil 22 is an alternating current, its amplitude varies depending on a positional relationship between the secondary coil 22 and the magnetic response unit 12.

Since the magnetic response units 12 are actually arranged side by side at each detection pitch C0, the change in amplitude is repeated at each detection pitch C0. In other words, when a horizontal axis represents the position of the sensor head 2 and a vertical axis represents the amplitude, the relationship between the amplitude and the position shows a cyclic curve (specifically, a sine curve y=sin θ) having the detection pitch C0 as a cycle. If this θ can be obtained, it is possible to acquire the position of the scale 1 with respect to the sensor head 2 in the detection pitch C0 that is a repeating unit.

However, considering one cycle of the sine curve y=sin θ, possible values of θ corresponding to y are two except for a special situation, and the value is not determined to be only one. Therefore, in this example, four secondary coils 22 are disposed at intervals determined by the above-described unit pitch C1 to have positional relationships, with the closest magnetic response unit 12, each substantially shifted by ¼ of the detection pitch C0.

As illustrated in FIG. 1, since the first coil 22a, the second coil 22b, the third coil 22c, and the fourth coil 22d are separated from each other by ¼ of the detection pitch C0, the coils output voltage signals whose phases are deviated from each other by 90°. Specifically, when the voltage signal output from the first coil 22a is expressed as a cos+phase, the second coil 22b outputs the voltage signal of a sin+phase, the third coil 22c outputs the voltage signal of a cos−phase, and the fourth coil 22d outputs the voltage signal of a sin−phase.

The processing device 3 processes the voltage signals output from the first coil 22a, the second coil 22b, the third coil 22c, and the fourth coil 22d, and calculates and outputs a relative displacement of the scale 1 with respect to the sensor head 2.

For example, as illustrated in FIG. 1, the processing device 3 includes a switching circuit 31, an AD conversion device 32, an arithmetic processing unit 35, and a filter processing unit 36. The AD conversion device 32 includes a first AD conversion unit 33 and second AD conversion unit 34.

In this example, the switching circuit 31 and the AD conversion device 32 are configured by an analog circuit and electronic components mounted on the circuit. The arithmetic processing unit 35 and the filter processing unit 36 are implemented by execution of a program by an FPGA or the like constituting the processing device 3. The FPGA is an abbreviation for field programmable gate array.

The switching circuit 31 is disposed between the secondary coil 22 and the AD conversion device 32. The switching circuit 31 has a plurality of switch elements, and switches an output destination of the voltage signal output from the secondary coil 22. Specifically, the switching circuit 31 is capable of switching between a first connection mode illustrated in FIG. 2 and a second connection mode illustrated in FIG. 3 according to a command from the FPGA.

Figure 2:
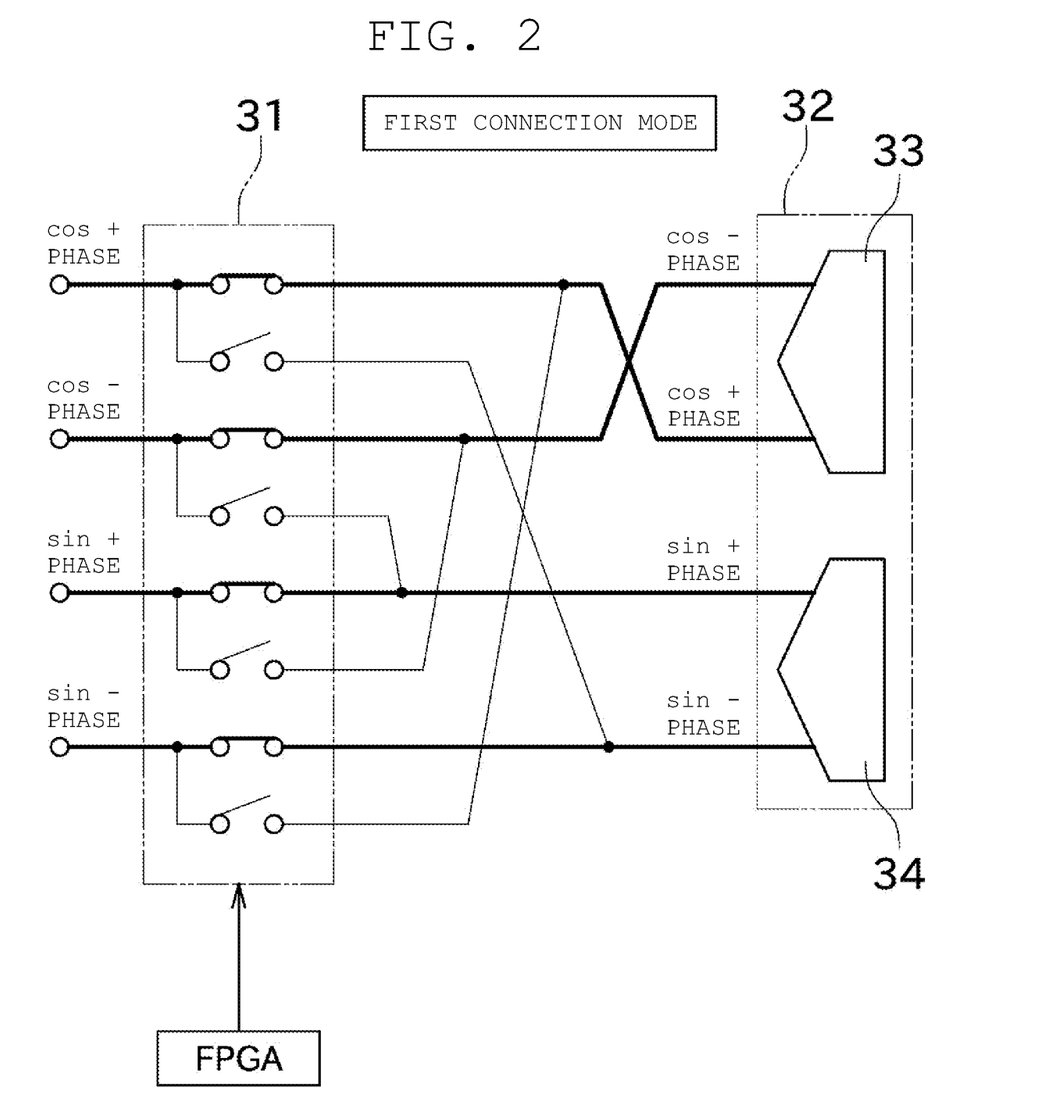
FIG. 2 is a diagram illustrating a first connection mode.

In the first connection mode illustrated in FIG. 2, the voltage signal of the cos+phase output from first coil 22a and the voltage signal of the cos−phase output from third coil 22c are input to the first AD conversion unit 33. Further, in the first connection mode, the voltage signal of the sin+phase output from the second coil 22b and the voltage signal of the sin−phase output from the fourth coil 22d are input to the second AD conversion unit 34. In the second connection mode illustrated in FIG. 3, the voltage signal of the sin+phase output from the second coil 22b and the voltage signal of the sin−phase output from the fourth coil 22d are input to the first AD conversion unit 33. Further, in the second connection mode, the voltage signal of the cos+phase output from the first coil 22a and the voltage signal of the cos−phase output from the third coil 22c are input to the second AD conversion unit 34. Timing at which the FPGA switches between the first connection mode and the second connection mode and the effect thereof will be described later.

The AD conversion device 32 is a two-channel type, and converts two-system analog signals into digital signals. Hereinafter, conversion from an analog signal to a digital signal is referred to as AD conversion. AD conversion by the first AD conversion unit 33 and AD conversion by the second AD conversion unit 34 can be performed. While in this example, one AD conversion device 32 performs two systems of AD conversion, two AD conversion devices may be provided instead. Each of the first AD conversion unit 33 and the second AD conversion unit 34 includes a differential amplifier. The differential amplifier amplifies a difference between two input signals to generate a differential signal.

In the first connection mode, the first AD conversion unit 33 generates a first differential signal based on the voltage signal of the cos+phase and the voltage signal of the cos−phase. In the first connection mode, the second AD conversion unit 34 generates a second differential signal based on the voltage signal of the sin+phase and the voltage signal of the sin−phase. When a phase representing displacement of the scale 1 with respect to the sensor head 2 is denoted by θ, a first differential signal y1 and a second differential signal y2 can be expressed by the following formulas:

$$y1 = a \cos \theta \cdot \sin \omega t$$

$$y2 = a \sin \theta \cdot \sin \omega t.$$

The first AD conversion unit 33 performs AD conversion of the first differential signal and outputs the converted signal to the arithmetic processing unit 35. The second AD conversion unit 34 performs AD conversion of the second differential signal and outputs the converted signal to the arithmetic processing unit 35.

Figure 3:
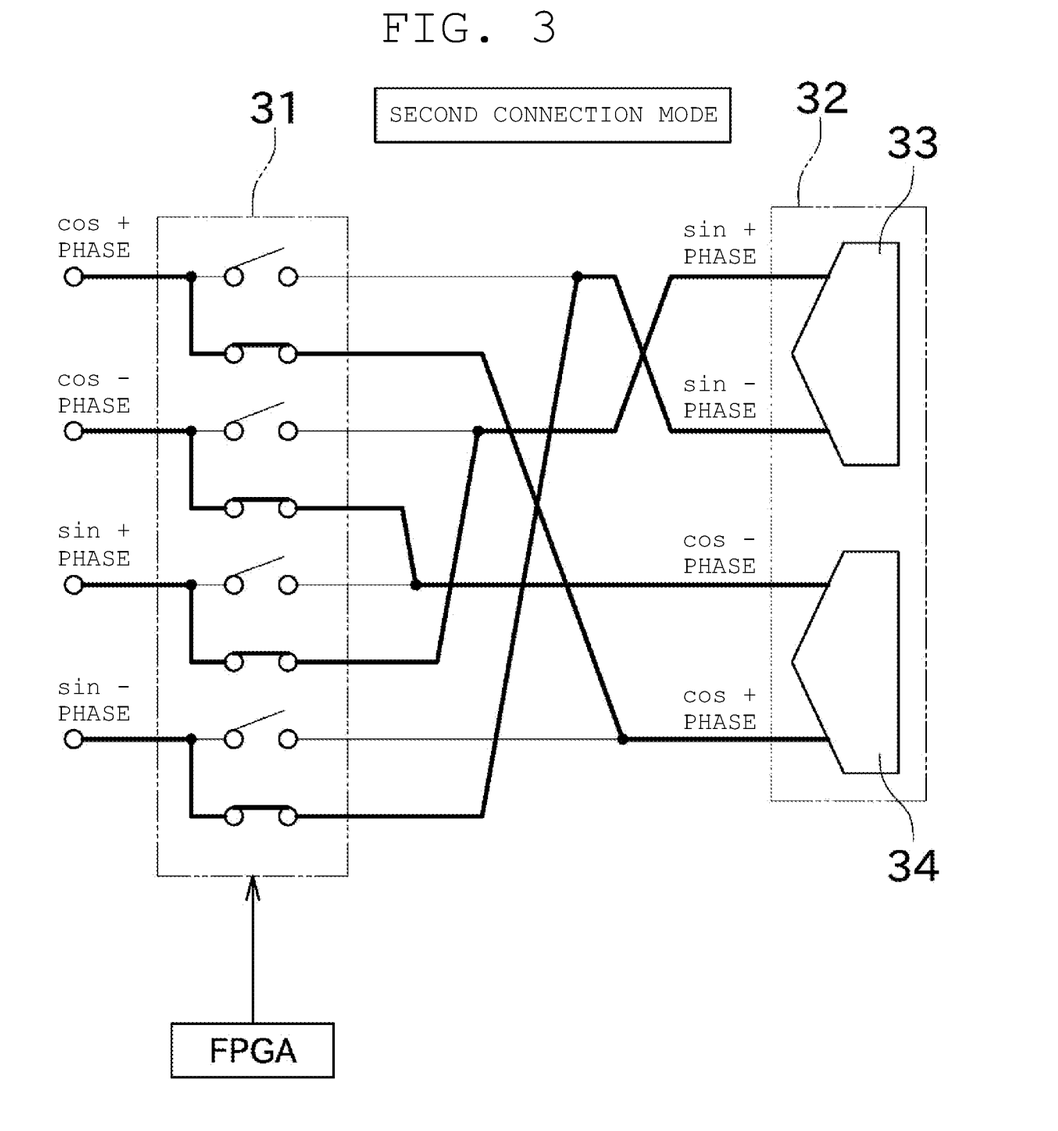
FIG. 3 is a diagram illustrating a second connection mode.

In the second connection mode, the first AD conversion unit 33 generates the second differential signal, performs AD conversion of the second differential signal, and outputs the converted signal to the arithmetic processing unit 35. In the second connection mode, the second AD conversion unit 34 generates the first differential signal, performs AD conversion of the first differential signal, and outputs the converted signal to the arithmetic processing unit 35.

In this example, a differential amplifier is contained in the AD conversion device 32. Instead of this configuration, a differential amplifier may be provided separately from the AD conversion device 32. In this configuration, the switching circuit 31 may be disposed between the differential amplifier and the AD conversion device 32. Upon receiving input of the first differential signal and the second differential signal, the switching circuit 31 switches between the first connection mode in which the first differential signal is output to the first AD conversion unit 33 and the second differential signal is output to the second AD conversion unit 34, and the second connection mode in which the first differential signal is output to second AD conversion unit 34 and the second differential signal is output to the first AD conversion unit 33.

The arithmetic processing unit 35 divides the second differential signal by the first differential signal. This result corresponds to a value of tan θ. Thereafter, the arithmetic processing unit 35 obtains an arctan value of the calculation result. As a result, the phase θ representing the displacement of the scale 1 with respect to the sensor head 2 can be obtained. θ, which is strictly a phase, substantially indicates a relative displacement of the scale 1 with respect to the sensor head 2. Therefore, θ may be referred to as displacement hereinafter.

The filter processing unit 36 performs filter processing on the displacement θ obtained by the arithmetic processing unit 35. The filter processing unit 36 is, for example, a moving average filter that calculates an addition average value of signal values. The filter processing unit 36 performs processing of calculating an addition average value of the displacement θ. This processing is substantially the same as processing of calculating an addition average value of cos phase detection values and an addition average value of sin phase detection values, and calculating the displacement θ using these addition average values. In other words, even if a target for which the filter processing unit 36 calculates an addition average value is the displacement θ, the filter processing unit 36 performs processing of calculating an ultimate displacement θ on the basis of the addition average value of the cos phase detection values and the addition average value of the sin phase detection values.

The filter processing unit 36 can be configured using, for example, a shift register. The shift register has a configuration in which a plurality of registers is cascade-connected. Every time a common shift clock is input to each register, data indicating the displacement θ(t) is sequentially transferred to a next-stage register. When the number of stages of the registers is N, the filter processing unit 36 can perform moving average processing of up to N stages (N is a positive integer). The N-stage moving average processing is processing of calculating an addition average value for the number N of detection values arranged in time series and repeatedly performing the processing according to time. A high frequency component included in the displacement θ(t) is removed by the filter processing by the filter processing unit 36. Accordingly, noise and the like can be removed. For example, the filter processing may be performed on the first differential signal and the second differential signal instead of the displacement θ.

As illustrated in FIG. 1, the displacement having been subjected to filtering and output by the filter processing unit 36 is output as position information after post-processing such as linearity calibration and high-speed prediction arithmetic operation.

Figure 4:
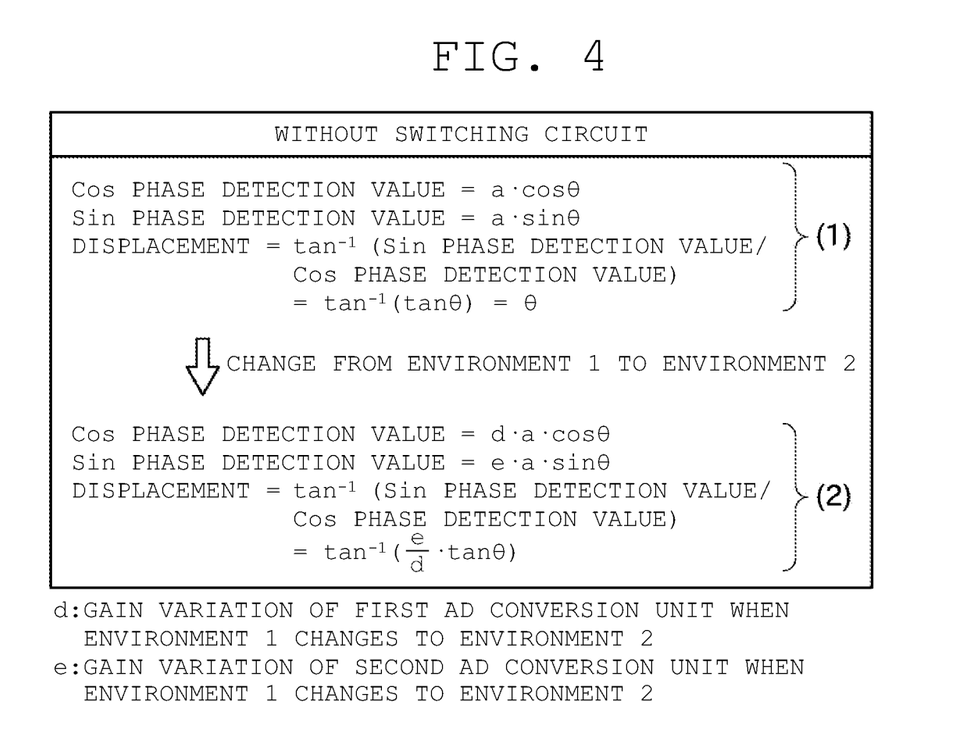
FIG. 4 is an explanatory diagram of processing of calculating displacement without a switching circuit.
Figure 5:
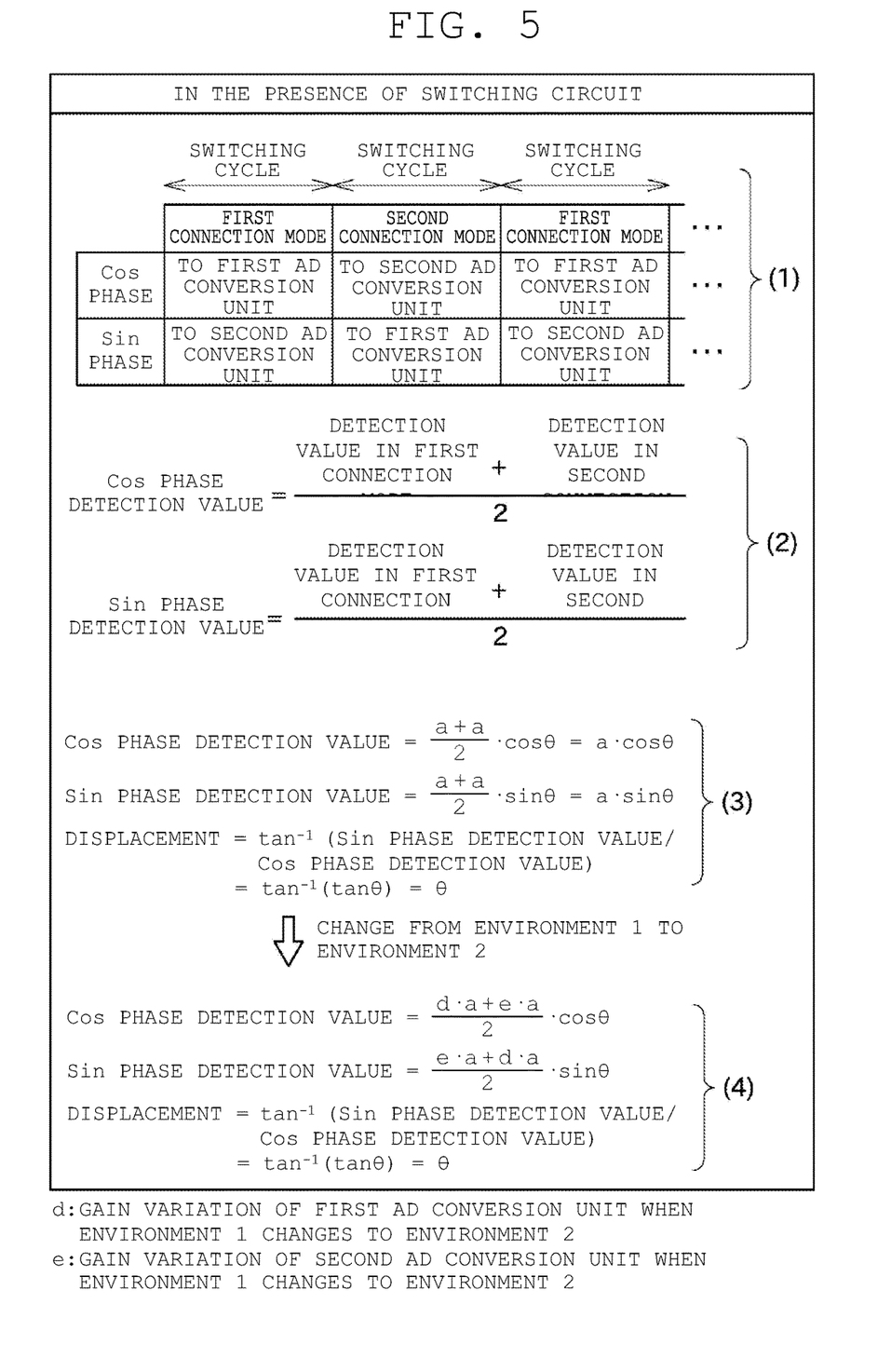
FIG. 5 is an explanatory diagram of processing of calculating displacement in the presence of the switching circuit.

Next, an influence of a change in environment on the displacement θ and a method of eliminating the influence will be described with reference to FIGS. 4 and 5.

First, a situation in which the environment 1 changes to the environment 2 in the displacement detection device not having the switching circuit 31 will be considered. The environment 1 and the environment 2 have different temperatures, for example. The AD conversion device 32 has environmental characteristics, and has a gain varying with a change in the environment. A gain variation of the first AD conversion unit 33 when the environment 1 changes to the environment 2 is denoted by d, and a gain variation of the second AD conversion unit 34 is denoted by e. Since the environmental characteristics have individual differences, d and e are different in general.

The displacement calculated in the environment 1 is denoted by θ as described above (see (1) in FIG. 4). On the other hand, when the environment 1 changes to the environment 2, since the first AD conversion unit 33 converts the first differential signal, a coefficient of the cos phase detection value changes from a to d·a. Since the second AD conversion unit 34 converts the second differential signal, a coefficient of the sin-phase detection value changes from a to e·a. As a result, the calculated displacement is represented as tan −1(e/d·tan θ) as illustrated in (2) of FIG. 4. In other words, an error according to a ratio of e to d occurs in the displacement calculated in the environment 2. As indicated by this formula, the error is caused by a difference between a temperature characteristic of the first AD conversion unit 33 and a temperature characteristic of the second AD conversion unit 34.

Next, displacement calculation performed by the displacement detection device 100 having the switching circuit 31 will be described. As illustrated in (1) of FIG. 5, the switching circuit 31 switches between the first connection mode and the second connection mode in each switching cycle. Although the switching cycle coincides with the excitation cycle, the switching cycle may be different from the excitation cycle as will be described later.

The cos phase detection value includes a detection value in the first connection mode and a detection value in the second connection mode. Similarly, the sin phase detection value includes a detection value in the first connection mode and a detection value in the second connection mode. The filter processing unit 36 calculates a displacement in consideration of both the detection value in the first connection mode and the detection value in the second connection mode by performing the moving average processing. Specifically, the filter processing unit 36 calculates displacement on the basis of an addition average of the displacement θ based on the detection value in the first connection mode and the displacement θ based on the detection value in the second connection mode. Although in this example, the filter processing unit 36 performs the moving average processing on the calculated displacement θ, in (2) of FIG. 5, to illustrate handling of the detection values of the first connection mode and the second connection mode in an easy-to-understand manner, an addition average value of the cos phase detection values and an addition average value of the sin phase detection values are described.

In the environment 1, the coefficient of the detection value of the differential signal AD-converted by the first AD conversion unit 33 is a, and the coefficient of the detection value of the differential signal AD-converted by the second AD conversion unit 34 is also a. In other words, there is no difference in the detection value even if conversion is performed by any AD conversion unit. Therefore, the displacement calculated by the displacement detection device 100 in the environment 1 is θ similarly to a displacement calculated by the displacement detection device not having the switching circuit 31 (see (3) of FIG. 5).

In the environment 2, the coefficient of the detection value of the differential signal AD-converted by the first AD conversion unit 33 is d·a, and the coefficient of the detection value of the differential signal AD-converted by the second AD conversion unit 34 is e·a. However, since the AD conversion by the first AD conversion unit 33 and the AD conversion by the second AD conversion unit 34 are equally performed by the switching circuit 31, both the coefficients of the respective detection values are an addition average value of d·a and e·a. In other words, even when the environment changes, the coefficients of the cos phase detection value and the sin phase detection value maintain the same state. As a result, since the coefficients cancel each other by displacement arithmetic operation, the displacement calculated by the displacement detection device 100 is θ also in the environment 2 (see (4) of FIG. 5). As described in the foregoing, by providing the switching circuit 31, it is possible to suppress an error caused by the environmental characteristics of the AD conversion device 32 even when the environment changes.

To further reduce an error caused by a difference between the temperature characteristic of the first AD conversion unit 33 and the temperature characteristic of the second AD conversion unit 34, it is preferable to set the moving average processing to even-numbered stages so that the detection values in the first connection mode and the detection values in the second connection mode are substantially uniformly included.

In the example described above, the switching cycle in which the switching circuit 31 switches between the first connection mode and the second connection mode coincides with the excitation cycle. However, the switching cycle may be an integral multiple of the excitation cycle. Specifically, in the detection values used in the moving average processing, it is preferable that the detection value in the first connection mode and the detection value in the second connection mode are substantially equal ratio. Therefore, when the N-stage moving average processing is performed, the switching cycle is preferably shorter than half the time during which the number N of detection values are detected. When the AD conversion device 32 is of the ΣΔ system, since the AD conversion device 32 calculates an error on the basis of a previous detection value and, therefore, the linearity might become higher as the cycle becomes longer, the switching cycle is preferably a plurality of times the excitation cycle rather than being matched with the excitation cycle.

Figure 6:
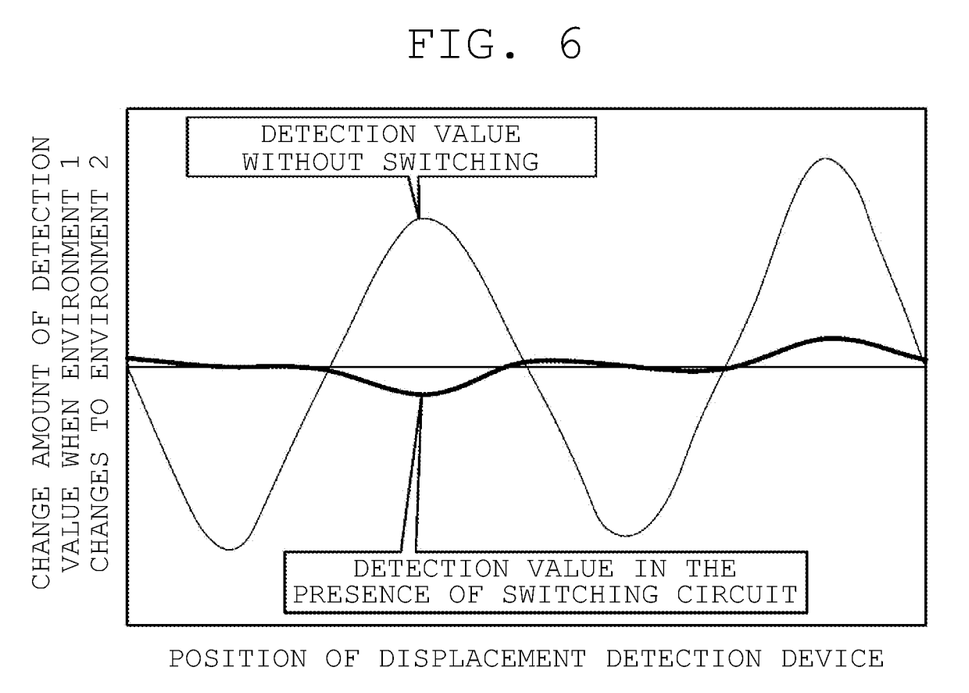
FIG. 6 is a graph illustrating a change amount of a detection value without the switching circuit and a change amount of a detection value in the presence of the switching circuit in an instance where environment is changed.

FIG. 6 illustrates a result of an experiment that confirms that provision of the switching circuit 31 suppresses a change in a detection value at the time of an environmental change. In this experiment, the sensor head 2 is disposed in a normal temperature environment, the processing device 3 is disposed in the environment 1 with a first temperature, and a detection value obtained when the sensor head 2 is moved is recorded. Next, while the sensor head 2 is disposed at a normal temperature, the processing device 3 is disposed in the environment 2 with a second temperature, and a detection value obtained when the sensor head 2 is moved is recorded. A horizontal axis of the graph of FIG. 6 represents the position of the sensor head 2, and a vertical axis of the graph of FIG. 6 represents a change amount of the detection value in the environment 2 with respect to the detection value in the environment 1.

A detection value of the displacement detection device without the switching circuit 31 greatly changes with a change in environment. By contrast, a detection value of the displacement detection device 100 having the switching circuit 31 changes a little even when the environment changes. Therefore, it has been confirmed that an error due to a change in environment hardly occurs as a result of provision of the switching circuit 31.

As described in the foregoing, the displacement detection device 100 includes the scale 1, the sensor head 2, and the processing device 3. In the scale 1, the magnetic response units 12 and the non-magnetic response units 11 are alternately arranged at a predetermined detection pitch in the displacement detection direction. The sensor head 2 has at least four magnetic detection elements (the first coil 22a, the second coil 22b, the third coil 22c, and the fourth coil 22d) that output output signals expressed by a sine function, a cosine function, a minus sine function, and a minus cosine function, respectively. The processing device 3 receives input of an output signal of the magnetic detection element, and calculates and outputs displacement information that is at least one of a relative displacement of the scale 1 with respect to the sensor head 2 and a change rate of the relative displacement. The processing device 3 includes the AD conversion device 32, the switching circuit 31, and the arithmetic processing unit 35. The AD conversion device 32 includes the first AD conversion unit 33 and the second AD conversion unit 34, and converts the first differential signal based on a difference between the cosine function and the minus cosine function and the second differential signal based on a difference between the sine function and the minus sine function into digital signals. The switching circuit 31 periodically switches between the first connection mode in which the first differential signal is AD-converted by the first AD conversion unit 33 and the second differential signal is AD-converted by the second AD conversion unit 34, and the second connection mode in which the first differential signal is AD-converted by the second AD conversion unit 34 and the second differential signal is AD-converted by the first AD conversion unit 33. Arithmetic processing unit 35 outputs the displacement information of the scale on the basis of an addition average value of the first differential signals output from the first AD conversion unit 33 and the second AD conversion unit 34 and an addition average value of the second differential signals output from the first AD conversion unit 33 and the second AD conversion unit 34.

As a result, influences of environmental characteristics of the first AD conversion unit 33 and environmental characteristics of the second AD conversion unit 34 on the respective differential signals can be made uniform. Therefore, it is possible to suppress an error in the displacement information when the environment changes.

In the displacement detection device 100 of this example, the arithmetic processing unit 35 calculates the displacement information of the scale 1 by arctan calculation.

As a result, displacement information can be obtained by simple arithmetic operation.

In the displacement detection device 100 of this example, the arithmetic processing unit 35 performs even-numbered stage moving average processing on the displacement information obtained by the arctan calculation.

As a result, by setting the moving average processing to the even-numbered stages, the number of the detection values in the first connection mode and the number of the detection values in the second connection mode can be equalized to calculate the addition average value so that the error of the displacement information can be further suppressed.

Although a preferred configuration has been described in the foregoing, the above configuration can be modified as follows, for example.

The scale 1 is not limited to the above-described configuration, and may have an appropriate configuration as long as different magnetic properties (strength of magnetism, direction of a generated magnetic field, and the like) are repeated. For example, the magnetic response unit 12 may be configured by alternately arranging ferromagnetic substances and feeble magnetic substances/nonmagnetic substances in the longitudinal direction of the scale 1. By arranging N poles and S poles of magnets, repetition of changes in magnetic properties may be realized.

The magnetic detection element may include a conductive pattern of a printed board, a Hall element or the like, instead of the secondary coil 22.

As long as the secondary coil 22 can capture a change according to the displacement from the scale 1 (magnetic response unit 12), the primary coil 21 may be disposed on the side close to the scale 1, and the secondary coil 22 may be disposed on the side far from the scale 1.

The arithmetic processing unit 35 is also capable of obtaining θ by a method other than calculating tan θ. Specifically, a phase of the second differential signal y2 is shifted by 90° by a known shift circuit and added to the first differential signal y1. The signal after the addition can be expressed as $a\sin(\omega t+\theta)$ according to the well-known trigonometric function addition theorem. The arithmetic processing unit 35 obtains θ by measuring a phase difference (to be specific, a difference in timing at which each signal crosses zero) between this signal and a reference differential signal $a\sin \omega t$. Furthermore, the arithmetic processing unit 35 is also capable of obtaining θ by phase-digital (PD) conversion.

Determination on a relative speed of the scale 1 in the filter processing unit 36 may not be performed in real time. For example, the determination may be performed at predetermined time intervals, or may be performed at time intervals that change according to the relative speed of the scale 1.

The displacement detection device is also capable of outputting, instead of or in addition to the relative displacement of the scale 1, a change rate (displacement information) of the relative displacement. The change rate of the relative displacement substantially represents the relative speed of the scale 1. The change rate of the relative displacement can be easily obtained by calculating a difference between a current relative displacement of the scale 1 and a relative displacement before a predetermined time.

While preferred examples have been described above, it is to be understood that variations and modifications will be apparent to those skilled in the art without departing from the scope and spirit of this disclosure. The scope of our devices, therefore, are determined solely by the appended claims.

What is claimed is:

1. A displacement detection device comprising:
    a scale on which magnetic response units and non-magnetic response units are alternately arranged at a predetermined detection pitch in a displacement detection direction;
    a sensor head having at least four magnetic detection elements that output signals expressed by a sine function, a cosine function, a minus sine function, and a minus cosine function, respectively; and
    a processing device that receives input of an output signal of the at least four magnetic detection elements, and calculates and outputs displacement information that is at least one of a relative displacement of the scale with respect to the sensor head and a change rate of the relative displacement, the processing device including:
    an analog circuit having a first AD conversion unit and a second AD conversion unit, and converts a first differential signal based on a difference between the cosine function and the minus cosine function and a second differential signal based on a difference between the sine function and the minus sine function into digital signals;
    a switching circuit that periodically switches between a first connection mode in which the first differential signal is AD-converted by the first AD conversion unit and the second differential signal is AD-converted by the second AD conversion unit, and a second connection mode in which the first differential signal is AD-converted by the second AD conversion unit and the second differential signal is AD-converted by the first AD conversion unit; and
    an FPGA/Field Programmable Gate Array that outputs the displacement information of the scale based on an addition average value of the first differential signals output from the first AD conversion unit and the second AD conversion unit and an addition average value of the second differential signals output from the first AD conversion unit and the second AD conversion unit.

2. The displacement detection device according to claim 1, wherein the FPGA/Field Programmable Gate Array calculates the displacement information of the scale by arctan calculation.

3. The displacement detection device according to claim 2, wherein the FPGA/Field Programmable Gate Array performs even-numbered stage moving average processing on the displacement information by the arctan calculation.

4. An arithmetic processing method of a displacement detection device, wherein the displacement detection device includes: a scale on which magnetic response units and non-magnetic response units are alternately arranged at a predetermined detection pitch in a displacement detection direction; a sensor head having at least four magnetic detection elements that output signals expressed by a sine function, a cosine function, a minus sine function, and a minus cosine function, respectively; and a processing device that receives input of an output signal of the at least four magnetic detection elements and calculates and outputs displacement information that is at least one of a relative displacement of the scale with respect to the sensor head and a change rate of the relative displacement,
    the processing device including: an Analog circuit having a first AD conversion unit and a second AD conversion unit, and converts a first differential signal based on a difference between the cosine function and the minus cosine function and a second differential signal based on a difference between the sine function and the minus sine function into digital signals; and a switching circuit that periodically switches between a first connection mode in which the first differential signal is AD-converted by the first AD conversion unit and the second differential signal is AD-converted by the second AD conversion unit, and a second connection mode in which the first differential signal is AD-converted by the second AD conversion unit and the second differential signal is AD-converted by the first AD conversion unit, and the processing device outputting the displacement information of the scale based on an addition average value of the first differential signals output from the first AD conversion unit and the second AD conversion unit and an addition average value of the second differential signals output from the first AD conversion unit and the second AD conversion unit.

5. The arithmetic processing method according to claim 4, wherein the processing device calculates the displacement information of the scale by arctan calculation.

6. The arithmetic processing according to claim 5, wherein the processing device performs even-numbered stage moving average processing on the displacement information obtained by the arctan calculation.

* * * * *